United States Patent [19]
Dautriche

[11] Patent Number: 4,727,597
[45] Date of Patent: Feb. 23, 1988

[54] MIXER ARRANGEMENT

[75] Inventor: Pierre B. Dautriche, Chennevieres, France

[73] Assignee: U.S. Philips Corporation, New York, N.Y.

[21] Appl. No.: 927,781

[22] Filed: Nov. 5, 1986

[30] Foreign Application Priority Data

Nov. 5, 1985 [FR] France ................ 85 16376

[51] Int. Cl.$^4$ ........................................... H04B 1/28
[52] U.S. Cl. ................................. 455/333; 455/253; 455/326
[58] Field of Search ............ 455/253, 333, 326; 330/277

[56] References Cited

U.S. PATENT DOCUMENTS

| | | | |
|---|---|---|---|
| 4,413,239 | 11/1983 | Romeo et al. ............. | 455/333 |
| 4,490,854 | 12/1984 | Bensussan et al. ........ | 455/333 |
| 4,596,959 | 6/1986 | Kawakami ................. | 330/277 |

FOREIGN PATENT DOCUMENTS

139505 8/1983 Japan ........................... 455/333

OTHER PUBLICATIONS

"A Monolithic GaAs IC for Heterodyne Generation of RF Signals" Van Tuyl, IEEE Trans. on Electron Devices, vol. ED 28, #2, Feb. 1981, pp. 166–170.
"A Monolithic GaAs FET RF Signal Generation Chip" Van Tuyl ISSCC, Feb. 1980.

*Primary Examiner*—Michael A. Masinick
*Attorney, Agent, or Firm*—Thomas A. Briody; William J. Streeter; Gregory P. Gadson

[57] ABSTRACT

Mixer arrangement suitable for use in a television receiver operating in the UHF band is disclosed. The arrangement contains a variable gain amplifier stage including a first field effect transistor whose first principal terminal referred to as drain is biased via a load by a DC supply source and whose control terminal referred to as gate receives a first RF signal at a first frequency which is modulated by a second signal at a second frequency applied to the amplifier stage through a variable resistor $T_2$ such that the output signal of the amplifier stage which is available at the first principal drain terminal of the first transistor is formed from the mixture of the first and the second signal. The second signal OL is applied via the variable resistor to the first principal drain terminal of the first transistor $T_1$ resulting in the variation of the amplifier gain occurring from the modulation of the load constituted by the biasing load above and the variable resistor. The second principal terminal referred to as source of the first transistor is directly brought to a reference potential.

8 Claims, 4 Drawing Figures

MIXER ARRANGEMENT

BACKGROUND OF THE INVENTION

The invention relates to a mixer arrangement comprising a variable gain amplifier stage including a first field effect transistor $T_1$ whose first principal terminal referred to as drain is biased via a load $T_3$ by a DC supply source $V_{DD}$ and whose control terminal referred to as gate receives a first RF signal to be mixed with a second signal OL applied to the first field effect transistor $T_1$ through a variable resistor $T_2$, such that the output signal IF of the amplifier stage available at the first principal drain terminal of the first transistor $T_1$ is formed from the mixture of the first and the second signal.

This arrangement is used for processing, for example, hyperfrequency signals in the field of receiving television transmission signals.

Such a mixer arrangement is known in the prior art from the publication by Rory Van Tuyl in "1980 IEEE Solid State Circuits Conference" in the issue of "ISSCC 80, Thursday, Feb. 14, Session X=Microwave Circuits, pages 118, 119" entitled "A monolithic GaAS FET RF Signal Generation Chip".

This publication particularly describes a mixer arrangement comprising an amplifier stage comprising a first field effect transistor constituting the actual amplifier section. The control or gate electrode of the first transistor receives a first signal at a first frequency which is mixed by a second signal at a second frequency. This second signal is applied to the source of the first transistor by means of a second field effect transistor used as a variable resistor. The drain of the first transistor, referred to as amplifier is biased from a DC supply through a load, and its source is biased with respect to ground by a third transistor being arranged as a current source, resulting in this amplifier stage functioning as a negative feedback amplifier. The mixture of the first and the second signal is available at the drain electrode of the first transistor, and constitutes the output signal of the variable gain amplifier. The third transistor, utilized as a current source, has a high impedance in order to interfere as little as possible in the mixer function. The second transistor, used as a variable resistor receives the signal from a local oscillator at its gate electrode and is given a condition in which its drain-source voltage is equal to zero.

The document cited above particularly describes a double and balanced arrangement of this mixer, permitting improvement of the isolation between the gates; that is to say, obtaining a satisfactory isolation between the signal from the local oscillator, the input signal of the mixer and the output signal.

The mixer circuit described in the document cited above has two serious drawbacks. The first drawback is that the noise factor of this circuit is very high. This is due to the presence of noisy elements applied to the source of the first transistor referred to as amplifier. A noisy element is, inter alia, the transistor used as a current source. The second drawback is that the satisfactory biasing conditions of the amplifier transistor are difficult to obtain.

SUMMARY OF THE INVENTION

The object of the invention is to obviate these drawbacks.

This object is achieved by means of an arrangement as described in the opening paragraph, and is characterized in that the second signal OL is applied through the variable resistor $T_2$ to the first principal drain terminal of the first transistor $T_1$ for modulating the load constituted by $T_3$ and $T_2$ resulting in a variation of the amplifier gain.

This arrangement may further be characterized in that the second principal terminal referred to as source of the first transistor $T_1$ is directly connected to a reference potential $V_M$.

The arrangement of the mixer type in accordance with the invention thus has, inter alia, the following advantages:

(a) the noise factor of this mixer is considerably improved in comparison with that of the prior art mixer;

(b) the amplifier stage is biased in a very simple manner;

(c) the conversion gain is very satisfactory and;

(d) the supply voltage required to make the novel arrangement function is lower than that with the prior art arrangement, so that its power consumption is reduced.

The mixer arrangement according to the invention may include two identical variable gain amplifiers which are coupled to each other and receive the second signal OL and its complementary signal $\overline{OL}$ and supply the output signal IF and its complementary signal $\overline{IF}$, respectively.

In a special embodiment of this arrangement, the second signal OL and its complementary signal $\overline{OL}$ are obtained from an oscillator, referred to as local oscillator, at outputs of an antiphase amplifier comprising a differential amplifier, an input of which receives the signal from the local oscillator.

With regard to the prior art arrangement, the invention further improves the isolation between the input signal RF, the output signal IF and the local oscillator signal.

DESCRIPTION OF THE DRAWINGS

The invention will now be described in greater detail with reference to the accompanying drawings in which.

DETAILED DESCRIPTION

Figure 1:
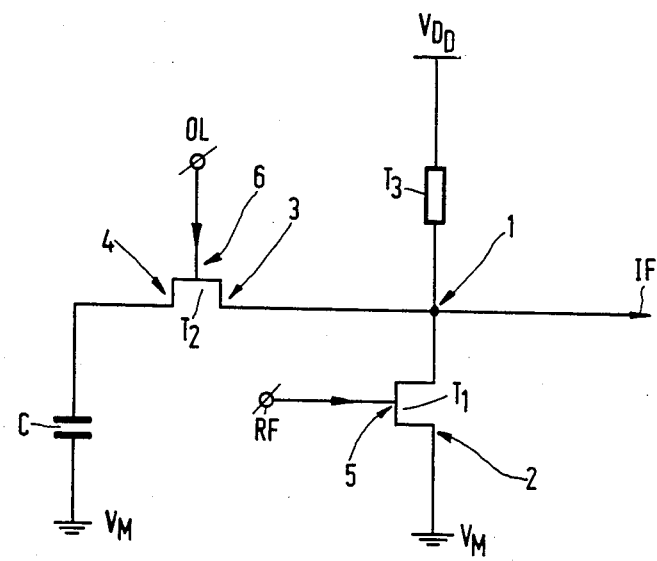
FIG. 1 shows the elementary mixer stage according to the invention.

As is shown in FIG. 1, the amplifier stage on which the mixer concept is based is an inverter stage. It is constituted by a first field effect transistor $T_1$ whose first principal terminal 1, referred to as drain electrode, is biased from a DC voltage $V_{DD}$ via a load $T_3$ and whose second principal terminal 2 referred to as source electrode is directly connected to a DC reference potential $V_M$, for example, ground. The control electrode 5, referred to as the gate electrode, receives a first signal RF at a first frequency referred to as reference frequency. This signal RF may be an antenna signal received at, for example, an aerial for hyperfrequencies.

The voltage gain A of this inverter stage is given by the relation (1):

$$A = -R \times g_m \tag{1}$$

In this relation $g_m$ is the transconductance of the transistor $T_1$ and R is the value of its total load.

To realize the function of the mixer with the aid of this amplifier stage, the voltage gain A is modulated. This modulation is generated in the arrangement according to the invention by modulation of the load R.

The modulation of the load R is obtained by variation of a variable resistor $T_2$ by means of which a second signal OL at a second frequency is applied to the first principal terminal 1 (drain) of the transistor $T_1$.

This variable resistor $T_2$ can be advantageously constituted by a field effect transistor, one of the principal terminals 4 of which is coupled to the reference potential $V_M$ through a DC isolating capacitor C, whose second principal terminal 3 is connected to the drain electrode 1 of the amplifier transistor $T_1$ and whose control electrode 6 (gate) receives the second signal OL. This signal may originate from a local oscillator.

Thus, no direct current flows through the transistor $T_2$ which is used as a variable resistor: it is biased in the triode zone. The signal OL applied to the gate electrode 6 will thus not entail any variation in the bias of the transistor $T_1$. This allows to connect the transistor $T_2$ directly to the first principal terminal 1 (drain) of the amplifier transistor $T_1$ and to eventually bias this transistor through a load $T_3$ of the resistive type.

This principle is fundamentally different from that used in the prior art arrangement in which the voltage gain is a function of the resistance value of a load at the drain, a variable source resistor and the impedance value of a current source at the source of a transistor constituting the amplifier stage, the latter being of the negative feedback amplifier type, while the variation in gain is obtained by modulation of the variable source resistor with the local oscillator signal.

According to the present invention, the grounding of the source 2 of the amplifier transistor results in a simpler assembly, a simpler biasing and a considerable improvement of the noise factor; and the application of the second signal OL to the drain 1 of the amplifier transistor allows for estimation of the gain by means of a very simple calculation, thus yielding a very simple and less costly design of the circuit.

The output signal IF, formed by mixing the first signal RF and the second signal OL, is available at the first principal terminal 1 (drain) of the amplifier transistor $T_1$. The conversion gain A is very satisfactory, and the isolation between the first signal, referred to as reference signal RF, and the second signal OL supplied, for example, by a local oscillator, is improved with respect to the prior art arrangement because, in the assembly according to the invention, it is not possible for the signal OL to radiate through to the gate electrode of the transistor $T_1$.

Figure 2:
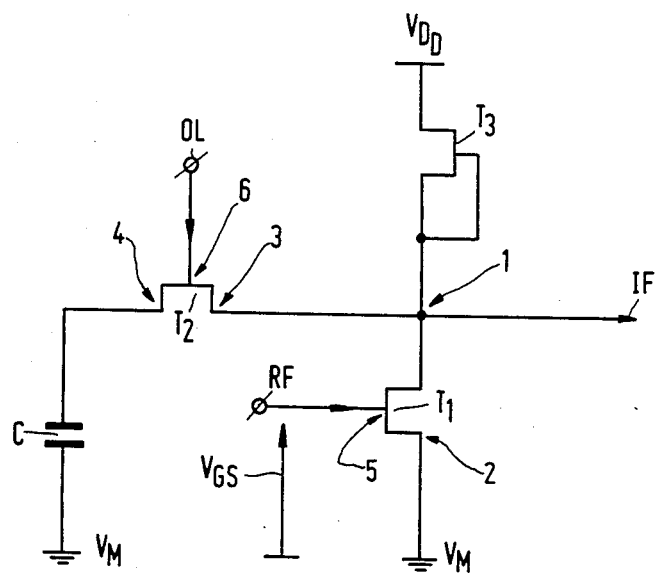
FIG. 2 shows the mixer stage in a particular embodiment.

FIG. 2 shows a modification of the arrangement of the mixer stage according to the invention in which the load $T_3$ is constituted by a field effect transistor arranged as a current source.

Figure 3:
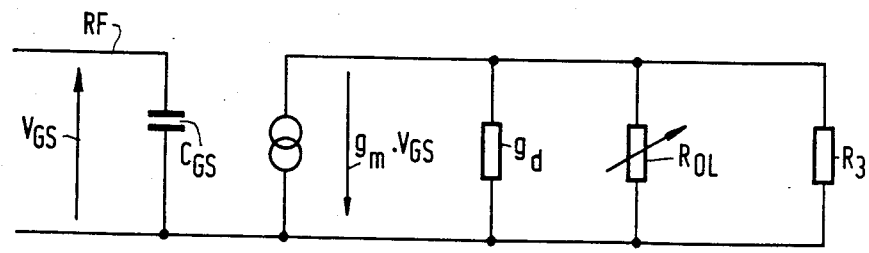
FIG. 3 shows an equivalent circuit diagram of the mixer stage according to the invention.

A simplified equivalent circuit diagram of the aforementioned elementary mixer stage is shown in FIG. 3. This diagram permits effecting a first order calculation of the conversion gain of the amplifier stage according to the invention.

This conversion gain A is given by the relation (2):

$$A = -(R_3 \cdot R_{OL})(R_{OL} + R_3 + g_d R_{OL} R_3)^{-1} \times g_m \tag{2}$$

in which $R_{OL}$ represents the resistance of the transistor utilized as a variable resistor $T_2$, $R_3$ represents the resistance value of the load $T_3$ and $g_d$ represents the conductance of the amplifier transistor $T_1$ at its drain electrode.

This relation shows that the gain of the arrangement according to the invention can be calculated and optimized in a simple manner as a function of the dimensioning of the transistors.

Figure 4:
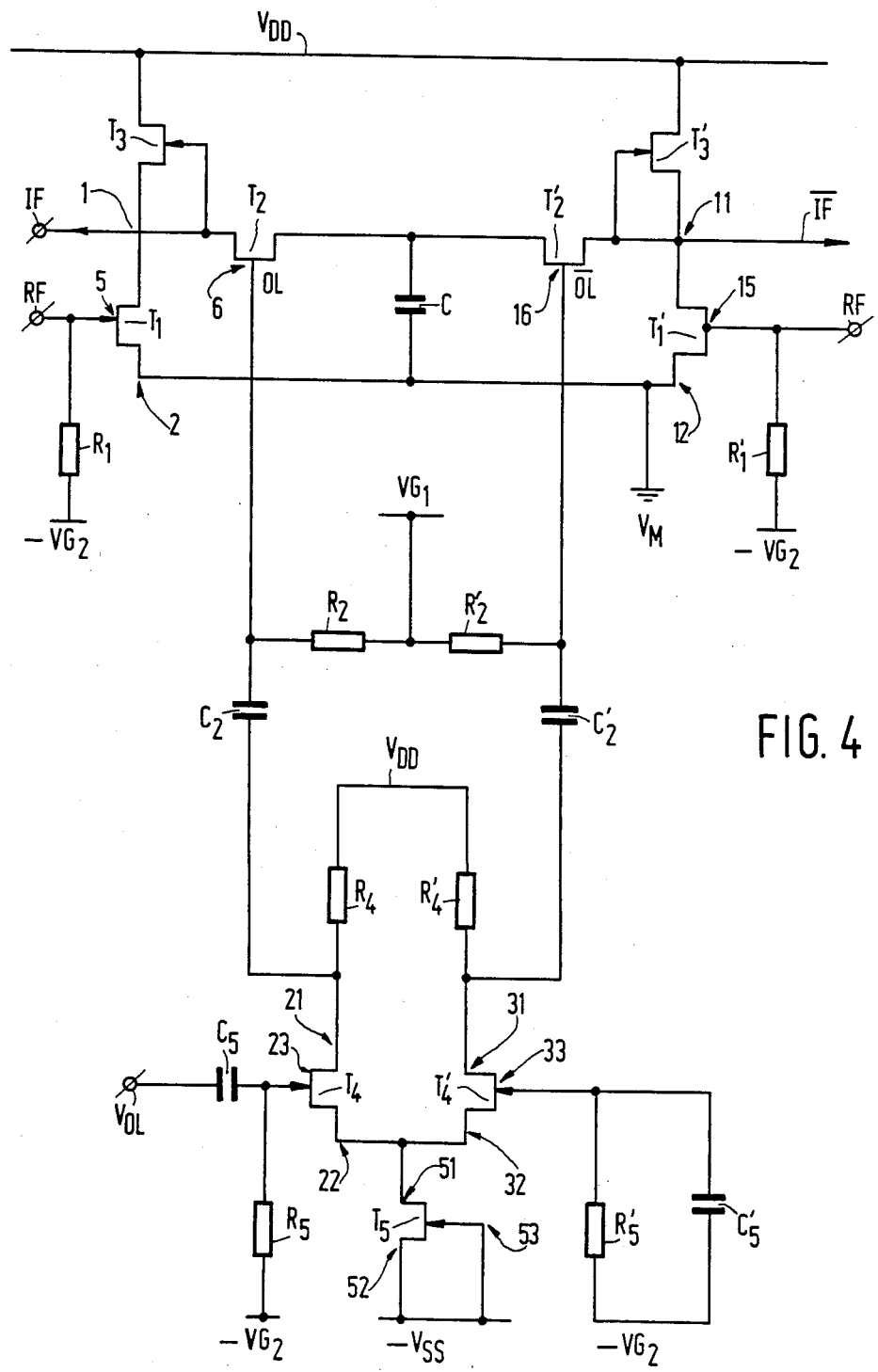
FIG. 4 shows an arrangement consisting of two coupled elementary mixer stages associated with an antiphase amplifier.

FIG. 4 shows an embodiment of a balanced mixer circuit, including two coupled elementary mixer stages according to the invention, forming two branches.

The first branch comprises a first mixer stage constituted by transistors $T_1$, $T_2$, $T_3$, and the second branch comprises a second mixer stage constituted by transistors $T'_1$, $T'_2$, $T'_3$, respectively identical to transistors $T_1$, $T_2$, $T_3$.

These two branches are coupled through the DC-isolation capacitor C of each of the transistors $T_2$ and $T'_2$ used as variable resistors in the two mixer stages.

Each of these mixer stages receives the input reference signal RF at the control electrodes or gates (5, 15) of the amplifier transistors $T_1$ and $T'_1$.

One of these mixer stages supplies the output signal IF at the first principal terminal 1 (drain) of the amplifier transistor, for example $T_1$, and receives the second signal OL at the control terminal 6 (gate) of the transistor used as a variable resistor, for example $T_2$.

The other mixer stage supplies the complementary output signal $\overline{IF}$ at the first principal terminal 11 (drain) of the amplifier transistor $T'_1$ and receives the complementary signal $\overline{OL}$ of the second signal at the control terminal 16 (gate) of the transistor used as a variable resistor $T'_2$.

In order to supply the second signal OL and its complementary signal $\overline{OL}$ in an appropriate manner, a differential antiphase amplifier is added to the aforementioned arrangement, and it is intended to supply the second signal OL and its complementary signal $\overline{OL}$ from the signal $V_{OL}$, which is directly supplied by, for example, a local oscillator.

This differential amplifier comprises two branches which are constituted by a field effect transistor $T_4$, whose drain electrode 21 is coupled to the supply voltage $V_{DD}$ via the load $R_4$ on the one hand, and by a field effect transistor $T'_4$ whose drain electrode 31 is coupled to the voltage $V_{DD}$ via the load $R'_4$ on the other hand. The source electrodes 22 and 32 of the transistors $T_4$ and $T'_4$ are coupled to the drain electrode 51 of a field effect transistor $T_5$ arranged in a current source, the short-circuited source electrode 52 and the gate electrode 53 are brought to a potential $-V_{SS} < V_M$.

The signal $V_{OL}$ from the local oscillator is applied, for example, to the control electrode 23 of the transistor $T_4$ of the differential amplifier by means of a circuit including the capacitor $C_5$ arranged in series with the input and the resistor $R_5$ arranged between the control electrode (gate) of the transistor $T_4$ and a d.c. potential $-V_{G2}$ so that:

$$-V_{SS} < -V_{G2} < V_M$$

The differential amplifier is DC-balanced by connecting a resistor $R'_5$ and a capacitor $C'_5$ arranged in parallel and connected to the potential $-V_{G2}$, to the control electrode 33 of the transistor $T'_4$ of the second branch.

The output signal OL and its complementary signal $\overline{OL}$ of this differential antiphase amplifier are applied by means of the capacitors $C_2$ and $C'_2$ to the control electrodes 6 and 16 (gates) of the transistors $T_2$ and $T'_2$ of the coupled mixer stages.

The biasing and balancing of the arrangement includes further, the connection of resistors $R_2$ and $R'_2$ between the control electrodes 6 and 16 of these transistors $T_2$ and $T'_2$ and a d.c. potential $VG_1$, $VG_1$ being chosen such that $$V_M < VG_1 < V_{DD}$$

as well as the connection of the resistors $R_1$ and $R'_1$ between the control electrodes 5 and 15 of the transistors $T_1$ and $T'_1$ and the potential $-VG_2$.

The circuit arrangement described in this embodiment, i.e. the coupled mixer stages and the differential antiphase amplifier, can be integrated advantageously on a gallium arsenide substrate whose properties are particularly favorable for realizing hyperfrequency circuits, and particularly circuits for the UHF band.

The field effect transistors used may be of the depletion type (i.e. normally, conducting in the absence of the gate-source signal), Tables I and II show the widths of the transistor gates and the values of the resistors used in the conditions in which the supply voltages are the following:

$$V_{DD} = +4 \text{ V} \quad -V_{SS} = -3 \text{ V}$$
$$V_{G1} = +1 \text{ V} \quad -V_{G2} = -1 \text{ V}$$
$$V_M = 0 \text{ V (ground)} V_T \simeq -2 \text{ V}$$

in which $V_T$ is the pinch-off voltage of the field effect transistors.

In the integration of the aforementioned circuit arrangement on a gallium arsenide substrate, the capacitor C, disposed between the transistors $T_2$ and $T'_2$ and ground and having a high value of the order of 1 nF, may not be integrated.

The described circuit arrangement has the following performances:

Conversion gain $G_C \simeq 4$ dB

Power consumption $P \simeq 75$ mW.

As described hereinbefore, this mixer circuit may be used in hyperfrequency applications and in the UHF band, and more specifically in the processing of signals provided by an aerial or an head end station used for the reception of television transmissions in the UHF band. In this application the reference signal RF is the signal provided by the aerial at a first frequency $f_1$ between 460 and 860 MHz. The local oscillator signal OL is provided at a second frequency $f_2$ between 430 and 830 MHz.

The circuit described has the advantage of a good performance, and it is simple and can be integrated, which is very favourable, for such an application of the circuit intended for the general consumer market.

TABLE I

| Transistors | Gate widths (μm) |
| --- | --- |
| $T_3$, $T'_3$ | 48 μm |
| $T_2$, $T'_2$ | 14 μm |
| $T_1$, $T'_1$ | 24 μm |
| $T_4$, $T'_4$ | 24 μm |
| $T_5$ | 24 μm |

TABLE II

| Resistors and capacitors | Values |
| --- | --- |
| $R_1$, $R'_1$ | 20k Ω |
| $R_2$, $R'_2$ | 20k Ω |
| $R_4$ | 1k Ω |
| $R'_4$ | 1,1k Ω |
| $C_5$, $C'_5$ | 1 pF |
| $C_2$, $C'_2$ | 1 pF |
| $R_5$, $R'_5$ | 20k Ω |
| C | 1 nF |

What is claimed is:

1. A mixer arrangement comprising:
   a field effect transistor $T_1$ having a drain connected through a resistance element to a first terminal of a DC voltage supply $V_{DD}$ and a source connected to a second reference terminal $V_M$ of said voltage supply, and having a gate connected to receive an RF signal; and,
   a variable resistance element $T_2$ electrically connected between said drain and source, said variable resistance element having a resistance which varies in accordance with a local oscillator signal applied to a control terminal of said variable resistance element, whereby the total gain of said field effect transistor measured between said gate and drain is varied as the shunt impedance provided by said variable resistance element varies.

2. An arrangement as claimed in claim 1, wherein the variable resistance element $T_2$ and a DC isolating capacitor C are connected in series between the drain terminal of the transistor $T_1$ and the reference terminal $V_M$.

3. An arrangement as claimed in claim 1, wherein the source of the transistor $T_1$ is directly connected to the reference potential $V_M$ terminal.

4. An arrangement as claimed in claim 3, wherein the drain connected resistance element is constituted by a field effect transistor.

5. An arrangement as claimed in claim 3, wherein the drain connected resistance element is constituted by a resistor.

6. An arrangement as claimed in claim 5, wherein the variable resistance element is constituted by a field effect transistor arranged as a triode.

7. A mixer arrangement comprising:
   a first field effect transistor amplifier having a gate connected to receive an RF signal, a drain connected through a DC load element to a first terminal of a DC voltage supply, and a source connected to a second common terminal of said DC voltage supply; and,
   a second field effect transistor having a drain and source capacitively coupled as a shunt impedance across said first field effect transistor source and drain, and a gate connected to receive a local oscillator signal, whereby the total impedance seen by said first transistor drain varies in accordance with said local oscillator signal, varying the total gain of said amplifier.

8. A balanced mixer arrangement comprising:
   first and second field effect transistors connected as amplifiers, each transistor having a common gate connection connected to receive an RF signal, each amplifier having a load resistance connecting a respective drain connection to a first terminal of a DC voltage supply, and each having common source connections connected to a second reference terminal of said DC voltage supply;

first and second shunt transistors capacitively connected between the drain and source connection of said first and second field effect transistors which vary the gain of said first and second transistors connected as amplifiers in accordance with a signal applied to each gate connection; and a differential amplifier having an input receiving a local oscillator signal, and first and second complementary outputs connected to gate connections of said first and second shunt transistors.

* * * * *